United States Patent
Worley et al.

(10) Patent No.: US 7,085,190 B2
(45) Date of Patent: Aug. 1, 2006

(54) VARIABLE BOOST VOLTAGE ROW DRIVER CIRCUIT AND METHOD, AND MEMORY DEVICE AND SYSTEM INCLUDING SAME

(75) Inventors: James Leon Worley, Flower Mound, TX (US); James Brady, Plano, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/944,498

(22) Filed: Sep. 16, 2004

(65) Prior Publication Data

US 2006/0056264 A1    Mar. 16, 2006

(51) Int. Cl.
*G11C 8/00*    (2006.01)

(52) U.S. Cl. .................... 365/230.06; 365/189.11; 365/204; 365/203

(58) Field of Classification Search .......... 365/230.06, 365/189.11, 204, 203
See application file for complete search history.

(56) References Cited

U.S. PATENT DOCUMENTS

| | | | | |
|---|---|---|---|---|
| 5,864,508 A | * | 1/1999 | Takashima et al. | 365/189.11 |
| 6,414,862 B1 | * | 7/2002 | Ogura | 365/60 |
| 6,421,295 B1 | * | 7/2002 | Mao et al. | 365/230.06 |
| 6,535,424 B1 | * | 3/2003 | Le et al. | 365/185.18 |
| 6,614,254 B1 | * | 9/2003 | Tamaki | 324/765 |

* cited by examiner

*Primary Examiner*—Connie C. Yoha
(74) *Attorney, Agent, or Firm*—Lisa K. Jorgenson; Bryan A. Santarelli

(57) ABSTRACT

A row driver circuit receives a supply voltage and operates to develop a boosted voltage having a magnitude that is equal to the sum of an incremental boost voltage and a magnitude of the supply voltage. The magnitude of the incremental boost voltage is a function of the magnitude of the supply voltage to maintain the boosted voltage at an approximately constant value independent of variations in the supply voltage. A method of generating a boosted voltage includes detecting a value of a supply voltage, generating an incremental boost voltage having a value that is a function of the detected supply voltage, and adding the generated incremental boost voltage to the supply voltage to generate the boosted voltage.

24 Claims, 9 Drawing Sheets

US 7,085,190 B2

VARIABLE BOOST VOLTAGE ROW DRIVER CIRCUIT AND METHOD, AND MEMORY DEVICE AND SYSTEM INCLUDING SAME

TECHNICAL FIELD

The present invention relates generally to integrated circuits, and more specifically to the generation of voltages for use in integrated circuits.

BACKGROUND OF THE INVENTION

FIG. 1 is a schematic block diagram of a portion of a conventional memory-cell array 100 for a dynamic random access memory (DRAM). The memory-cell array 100 includes a number of memory cells 102 arranged in rows and columns, each memory cell including an access switch in the form of an NMOS transistor 104 and a storage element in the form of a capacitor 106. The capacitor 106 includes a first plate that receives a reference potential which is typically equal to approximately a supply voltage Vdd divided by two (Vdd/2), with the first plate typically being common to the first plates of all other capacitors in the array 100. The reference potential applied to the first plate of the capacitors 106 may be any value between Vdd and ground or another a low reference supply Vss, as will be appreciated by those skilled in the art. A second plate of the capacitor 106 is coupled to the drain of the transistor 104. Each of the memory cells 102 stores a single bit of binary data in the form of a voltage across the capacitor 106. A voltage of approximately Vdd at the second plate of the capacitor 106 corresponds to a first binary data value and a voltage of approximately zero volts at the second plate corresponds to a second binary data value.

The memory cells 102 are arranged in n rows and m columns, with one memory cell positioned at the intersection of each row and column. Each row of memory cells 102 has an associated word line WL0-WLN-1 and each column of memory cells has an associated pair of true and complementary bit lines BL0, BL0*-BLM-1, BLM-1*, where the bit "*" indicates that data on the complementary bit line is the complement of data on the associated true bit line, as will be appreciated by those skilled in the art. The bit lines may be referred to generally as BL, BL* and the word lines as WL in the following description. Each memory cell 102 in a given row of memory cells has a control terminal in the form of the gate of the transistor 104 coupled to the associated word line WL0-WLN-1 and each memory cell in a given column of memory cells has a data terminal in the form of the source terminal of the transistor 104 coupled to one of the associated complementary bit lines BL0, BL0*-BLM-1, BLM-1*.

Each pair of bit lines BL,BL* is coupled to a corresponding sense amplifier 108 that senses and stores data in an addressed memory cell 102 coupled to one of the corresponding bit lines. In the simplified diagram of FIG. 1, each sense amplifier is assumed to include isolation transistors for selectively coupling and decoupling the sense amplifier from the corresponding bit lines BL, BL* and equilibration transistors coupled between the pair of bit lines for driving or "equilibrating" the bit lines to equal voltages when activated.

In operation of the memory-cell array 100, before data is read from the memory cells 102, control circuitry (not shown) in the DRAM executes an equilibration cycle. During the equilibration cycle, row drivers in the control circuitry drive each of the word lines WL low, thereby deactivating each of the memory cells 102. At the same time, each sense amplifier 108 equilibrates the associated bit line BL, BL* to equalize the voltage on each bit line to approximately Vdd/2. After the equilibration cycle, the row driver of the word line WL of the addressed memory cell 102 is driven with a boosted or "pumped" voltage Vpp which is greater than Vdd to activate each memory cell coupled to the activated word line. In response to the voltage VPP on activated word line WL, the transistor 104 in each activated memory cell 102 coupled to that word line is turned ON and charge is transferred between the memory cell and the associated bit line BL, BL*. For example, if the word line WL0 is activated charge is transferred between the capacitors 106 in each memory cell 102 coupled to this word line and the associated complementary bit lines BL0*, BLM-1*.

This charge transfer results in the complementary bit lines BL0*, BLM-1* either increasing slightly above or decreasing slightly below the equilibrated voltage of Vdd/2, depending on the logic state of data stored in the memory cell 102. Each sense amplifier 108 then compares the voltage on the complementary bit line BL, BL* coupled to the activated memory cell 102 to the voltage of Vdd/2 on the other bit line. In response to the sensed voltage differential between the bit lines BL, BL*, each sense amplifier 108 drives the higher bit line to approximately Vdd and drives the lower bit line to approximately zero volts. The voltage levels on each pair of bit lines BL, BL* coupled to the activated memory cells 102 now represents the binary value of the data stored in the activated memory cell in that column of memory cells. The data contents of the addressed memory cells 102 are then read from each sense amplifier 108 coupled to a column of an addressed memory cell by read/write circuitry (not shown in FIG. 1). During a write operation, data is transferred through a read/write data path (not shown) and applied to the respective bit lines BL, BL* of addressed memory cells 102, with the word line WL of the row containing the addressed memory cells being driven high to thereby couple the voltage on one of the bit lines to the capacitors 106 in the addressed memory cells 102.

As described above, the row drivers drive each word line WL with a pumped voltage Vpp that is greater than the supply voltage Vdd. This enables the storage capacitors 106 to be charged to the full supply voltage Vdd when binary data corresponding to this voltage level is to be stored in the memory cell 102. More specifically, to enable the access transistors 104 in each memory cell 102 to charge the capacitor 106 to the voltage Vdd on the associated bit line BL, BL* the voltage on the word line WL applied to the gate of that transistor must be greater than the voltage Vdd. This is true because to remain turned ON each transistor 104 must receive a gate-to-source voltage that is greater than a threshold voltage VT required to keep the transistor turned ON. This threshold voltage VT is shown for the memory cell 102 in row 0 and column 0 in the array of FIG. 1 and corresponds to the voltage between the bit line BL0* and the word line WL0. Thus, to remain turned ON to charge the capacitor 106 to Vdd, the pumped voltage Vpp on the word line WL0 must greater than the supply voltage Vdd by at least the threshold voltage VT (Vpp>Vdd+VT).

In a typical DRAM, a charge pump (not shown in FIG. 1) generates the pumped voltage Vpp from the supply voltage Vdd, as will be appreciated by those skilled in the art. In other instances, the pumped voltage Vpp is supplied to the DRAM from an external power supply. For example, an application specific integrated circuit (ASIC) is a chip designed for a specific application, and many times including a DRAM portion for data storage during operation. A typical ASIC may also include bipolar components for interfacing the ASIC to external circuitry, for example, or other components that do not operate at conventional supply voltage supplied to components in the DRAM portion. As a result, a typical ASIC receives a low supply voltage Vdd for powering circuitry in the DRAM portion and other low voltage circuitry in the ASIC and also receives a high supply voltage Vpp for powering bipolar or other higher voltage components in the ASIC.

Since the ASIC receives the voltage Vpp from an external voltage source, this higher voltage may be directly applied to the DRAM portion of the ASIC to be used in generating the pumped voltage required for driving the word lines WL in the memory-cell array 100. This high supply voltage Vpp is not typically high enough to be used directly in driving the word lines WL but instead must be boosted, albeit not by as much as if the low supply voltage Vdd was being boosted to generate the required voltage for driving the word lines WL. In this situation, two independent supply voltage sources supply voltages to the ASIC, one generating the low supply voltage Vdd and one generating the high supply voltage Vpp. These two supply voltages may vary in different ways as a function of various parameters such as time and temperature. As a result, the differential between these voltages may vary over time, resulting in a larger differential voltage between these two supply voltages Vdd and Vpp depending on how the voltage vary as function of various parameters.

High voltages across components in the memory-cell array 100 such as the NMOS transistors 104 stress these components and can thereby damage and reduce the operable life of such components. This is true, for example, because higher voltages break down oxide layers in such devices, such as the oxide layer formed between the gate and a channel region of each transistor 104. Thus, as the differential voltage between the supply voltages Vdd and Vpp increases some components in the memory-cell array 100 DRAM may be stressed due to being subjected to higher voltages. Such stress on components in the array 100 may damage and reduce the operational life of components in the DRAM, reducing the overall operational life of the ASIC.

As previously mentioned, the high supply voltage Vpp must typically be boosted to generate the required boosted voltage for the word lines WL in the array 100. This boosted voltage is typically a function of the magnitude or value of the high supply voltage Vpp and thus varies as this supply voltage varies. For example, assume the nominal value of the high supply voltage Vpp is 3.3 volts and that boost circuitry in the DRAM portion of the ASIC generates a boosted voltage of 4.2 volts when the high supply voltage equals this nominal value. Thus, in this example an incremental boost voltage of 0.9 volts (4.2 volts–3.3 volts) is added to the high supply voltage Vpp to generate the boosted voltage. This incremental boost voltage is added regardless of the value of the high supply voltage Vpp, meaning that if the high supply voltage increases to 3.6 volts the boosted voltage now equals 4.5 volts. Thus, as the supply voltage Vpp increases the boosted voltage increases due to the constant incremental boost voltage. This can result in higher than desired voltages across components in the memory-cell array, stressing such components as previously discussed and thereby reducing the overall operational life of the ASIC.

There is a need for a circuit and method of providing boosted voltages in DRAMs and other integrated circuit devices that are great enough to ensure proper operation of the devices but not too large to reduce the operational lives of such devices.

SUMMARY OF THE INVENTION

According to one aspect of the present invention, a row driver circuit receives a supply voltage and operates to develop a boosted voltage having a magnitude that is equal to the sum of an incremental boost voltage and a magnitude of the supply voltage. The magnitude of the incremental boost voltage is a function of the magnitude of the supply voltage to maintain the boosted voltage at an approximately constant value independent of variations in the supply voltage.

According to another aspect of the present invention, a method of generating a boosted voltage includes detecting a value of a supply voltage, generating an incremental boost voltage having a value that is a function of the detected supply voltage, and adding the generated incremental boost voltage to the supply voltage to generate the boosted voltage.

DETAILED DESCRIPTION OF PREFERRED EMBODIMENTS

Figure 1:
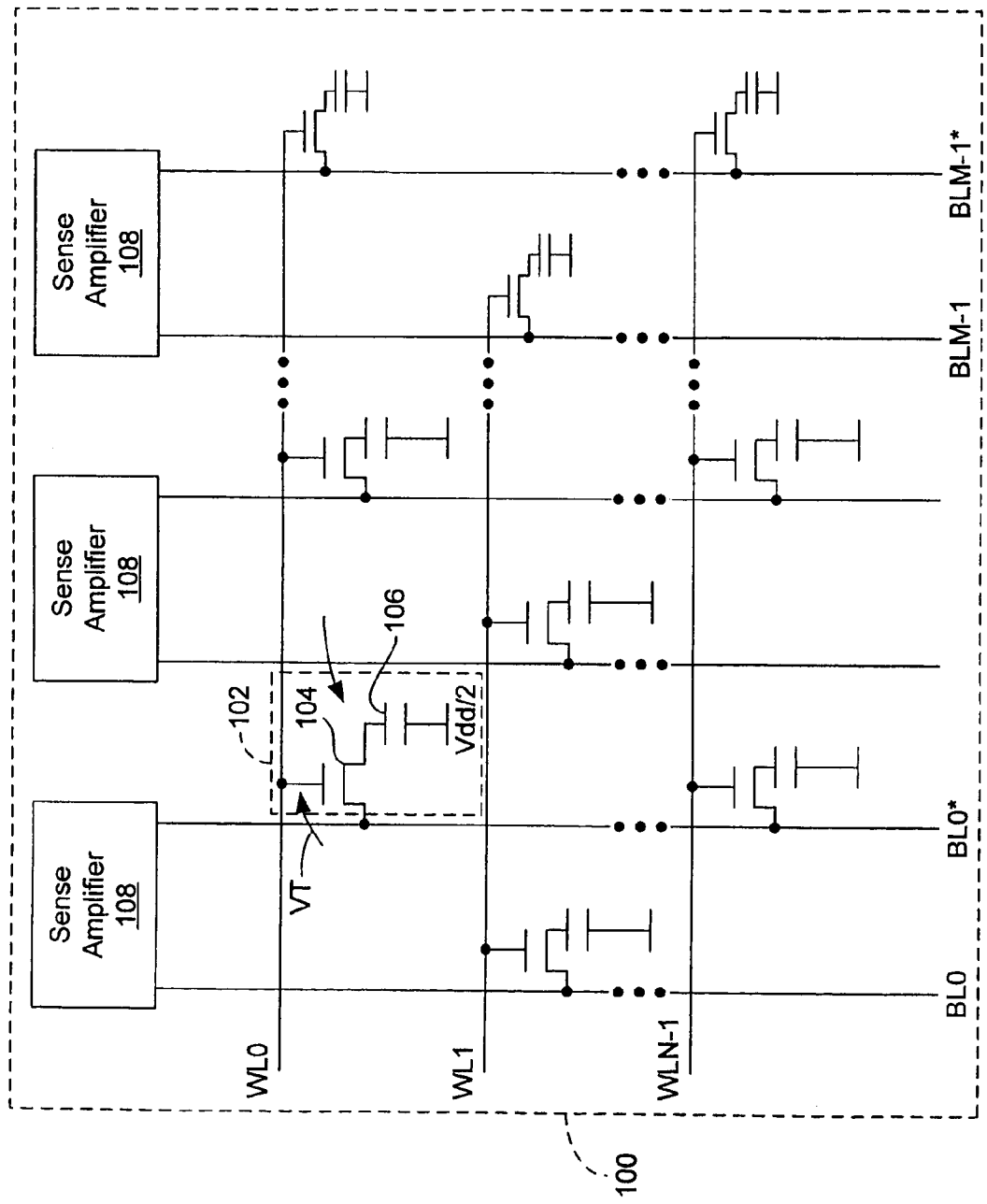
FIG. 1 is a schematic block diagram of a conventional DRAM memory-cell array.
Figure 2:
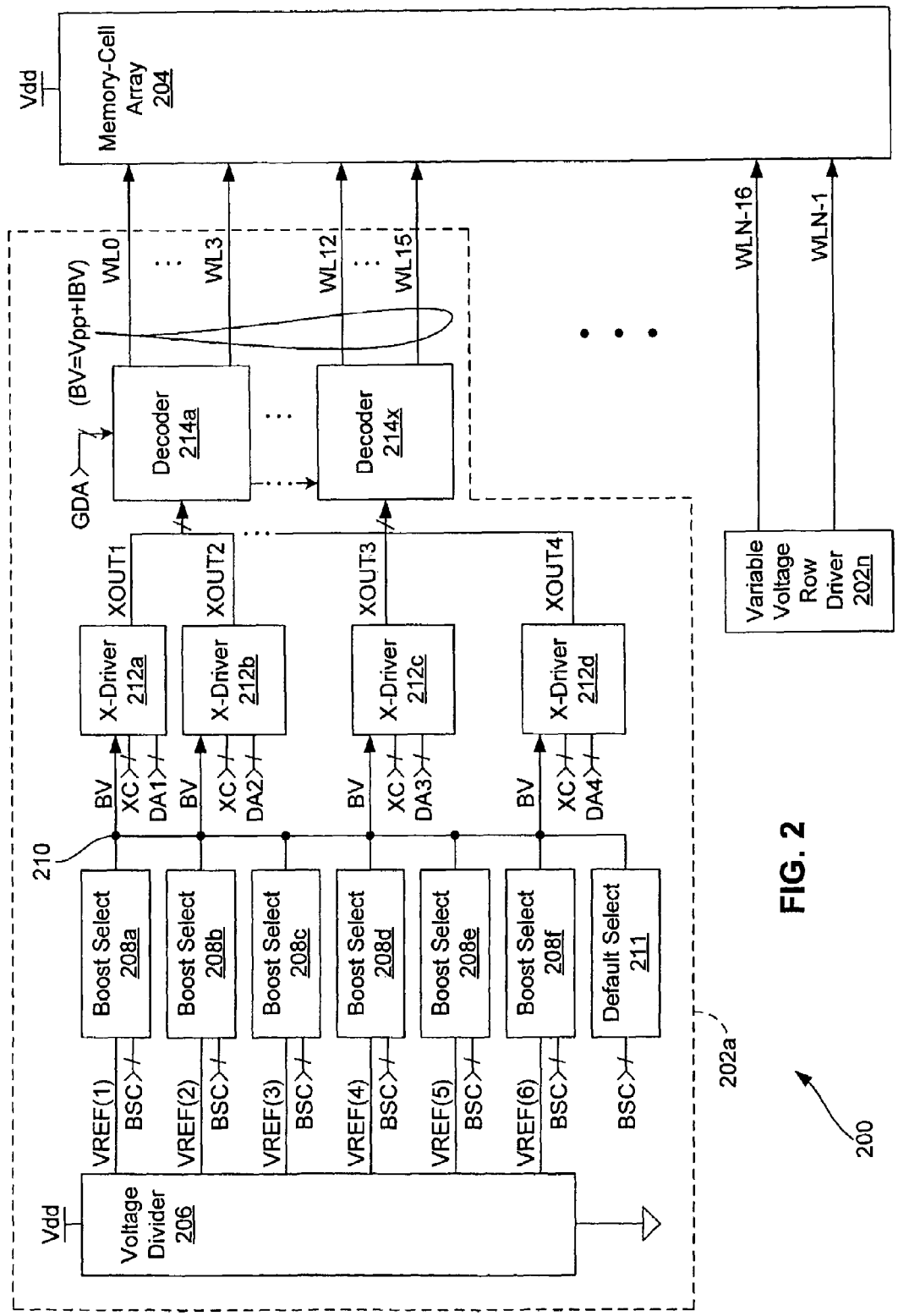
FIG. 2 is a functional block diagram of a portion of DRAM including a plurality of variable voltage row drivers that collectively develop a variable incremental boost voltage having a value that is a function of a value of a supply voltage according to one embodiment of the present invention.

FIG. 2 is a functional block diagram of a portion of a DRAM 200 including a plurality of variable voltage row drivers 202a–n that collectively develop an incremental boost voltage IBV having a value that is a function of a value of a high supply voltage Vpp according to one embodiment of the present invention. The incremental boost voltage IBV plus the supply voltage Vpp equals a boosted voltage BV, and a selected one of the row drivers 202a–n applies the boosted voltage BV on a selected one of a group of associated word lines WL in a memory-cell array 204. The selected word line WL receiving the boosted voltage BV activates a corresponding row of memory cells (not shown) in the memory-cell array 204 in response to the boosted voltage.

The boosted voltage BV ensures data is properly written to and read from memory cells in the array 204. In contrast to conventional row drivers, the variable incremental boost voltage IBV varies as a function of the value of the supply voltage Vpp. As a result, the row drivers 202a–n generate the boosted voltage BV that is approximately constant as the supply voltage Vpp varies since the boosted voltage equals the variable incremental boost voltage IBV plus the supply voltage. The boosted voltage BV has a value sufficient to ensure proper operation of the DRAM 200 but not greater than required for such operation. This prevents components in the DRAM 200 from being damaged and thereby having their operational lives reduced due to higher than necessary voltages being applied to the components.

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well known components and/or processes has not been shown or described in detail below to avoid unnecessarily obscuring the present invention. Also, in the present description where multiple components are designated by reference numbers and letters, such as the row drivers 202a–n, the components may for ease of description be referred to simply with the reference number when referring generally to all the components and with both the number and letter when referring to a particular one of the components.

Only the row driver 202a is shown in detail in FIG. 2 and will be discussed in more detail below, with the remaining row drivers 202b–n being identical in construction and operation. The row driver 202a includes a voltage divider 206 that develops a plurality of reference voltage signals VREF<1>–VREF<6>, each reference voltage signal having a threshold value when the supply voltage Vpp equals a corresponding value. For example, in one embodiment each reference voltage signal VREF<1>–VREF<6> sequentially equals the threshold value as the supply voltage Vpp varies from 3 volts to 3.6 volts. In this embodiment, when the supply voltage Vpp equals 3.05 volts the reference voltage signal VREF<1> equals the threshold voltage, and when the supply voltage equals 3.15 volts the reference voltage signal VREF<2> equals the threshold voltage, and so on for the remaining reference voltage signals with the reference voltage signal VREF<6> being equal to the threshold voltage when the supply voltage equals 3.55 volts.

Six boost select circuits 208a–f receive the reference voltage signals VREF<1>–VREF<6>, respectively, along with a plurality of boost select control signals BSC. Each boost select circuit 208a–f is activated when the corresponding reference voltage signal VREF is equal or greater than the threshold value, and when activated generates an output signal that is applied to a boost node 210 in response to the BSC signals. The output signals from the activated boost select circuits 208a–f each cause some charge to be pumped to the node 210 and then to a selected word line WL, as will be described in more detail below. The number of activated boost select circuits 208 determines the amount of charge pumped from the node 210 and routed to the selected word line WL, and in this way determines the value of the boost voltage BV developed on the selected word line WL. The output signal generated by each boost select circuit 208 corresponds to a voltage-boosted signal across a capacitor as commonly used in charge pump circuits, and the operation of such charge pump circuits will be understood by those skilled in the art. Moreover, this operation will become apparent from a more detailed description of an embodiment of one of the boost select circuits 208 that will be discussed below with reference to FIG. 4. Briefly, each boost select circuit 208 boosts the voltage on the node 210 when activated and in this way pumps charge to the node 210 that is routed to the selected word line WL. A default boost select circuit 211 also applies an output signal to the node 210 responsive to the BSC signals independent of the value of the supply voltage Vpp. The default boost circuit 211 thus receives no reference voltage VREF from the voltage divider 206, but instead generates the output signal on the node 210 responsive to the BSC signals to provide a default boost signal on the node 210. For example, returning to the above example, if the supply voltage Vpp equals 3.6 volts then only the default boost circuit 211 is activated responsive to the BSC signals. In this situation, the output signal from the default boost circuit 211 pumps charge from the node 210 that results in an incremental boosted voltage IBV value of 0.6 volts to thereby generate the boosted voltage BV equal to 4.2 volts (3.6 volts+0.6 volts).

The boosted voltage BV on the node 210 is applied to four X-drivers 212a–d that each receives a plurality of X-driver control signals XC and a respective group of decoded address signals DA1–DA4. Each X-driver 212 when activated responsive to the corresponding DA1–DA4 signals transfers charge from the node 210 onto a corresponding output XOUT1–XOUT4. All X-drivers 212 receive the control signals XC, but only the X-driver activated responsive to he DA1–DA4 signals transfers charge from node 210 onto the output XOUT1–XOUT4, with the remaining X-drivers driving their outputs inactive low. Only one of the X-drivers 212 is activated at time and only when the corresponding row driver 202 is activated. The selected X-driver 212 also precharges the node 210 to the supply voltage Vpp prior to activation of the boost select circuits 208, as will be described in more detail below.

A number of decoders 214a–x receive the outputs XOUT1–XOUT4 from the X-drivers 212 and also receive the group decoded address signals GDA. One of the decoders 214 is activated responsive to the GDA signals, and the activated decoder couples the outputs XOUT1–XOUT4 to four associated word lines WL. For example, the decoder 214a couples the outputs XOUT1–XOUT4 to the word lines WL0–3, the decoder 214b (not shown) couples the outputs to word lines WL4–7, and so on. The number of decoders 214 in each variable voltage row driver 202 typically depends on the number of rows in the memory-cell array 204 associated with a particular sense amplifier (not shown) in the array. In the example embodiment of FIG. 2, each row driver 202 includes four decoders 214 and thus the decoder designated 214x couples the outputs XOUT1–XOUT4 to the word lines WL 12–15 as indicated. In operation, the activated decoder 214 couples the activated output XOUT1–XOUT4 to the associated word line WL to transfer charge from the node 210 through the corresponding X-driver 212 and onto the selected word line, thereby generating the boosted voltage BV on the selected word line. The decoders 214 in each row driver 202a–n operate in the same way, coupling the corresponding four outputs XOUT1–XOUT4 to the appropriate one of the corresponding 16 word lines WL. For example, in the row driver 202n the decoders 214a–x (not shown for driver 202n) couple the corresponding four outputs XOUT1–XOUT4 (not shown for driver 202n) to the corresponding four word lines in the group of word lines WLN-1–WLN-16. A low supply voltage Vdd is applied to the memory-cell array 204 to provide power to the memory cells (not shown) and other components in the array. In the embodiment of FIG. 2, the memory-cell array 204 is an n-channel array, meaning the transistors forming the array are NMOS type devices. In another embodiment, the array 204 is a p-channel array in which the transistors forming the array are PMOS type devices. In this embodiment, the polarities of voltages and suitable changes in components in the variable voltage row drivers 202 are made as required and as will be understood by those skilled in the art.

In operation, the activated one of the row drivers 202a–n operates to develop the boosted voltage BV on the selected or addressed one of the corresponding word lines WL. Other address decode and control circuitry (not shown) in the DRAM 200 decodes address signals supplied to the DRAM in response to these decoded address signals develops the BSC, XC, DA, and GDA signals to activate the appropriate row driver 202 which, in turn, activates the addressed word line WL in the memory-cell array 204. The addressed word line WL is the word line corresponding to the row address signals supplied to the DRAM 200. The row driver 202a shown in more detail is assumed to be the activated row driver in the following description, and thus the row address signals supplied to the DRAM 200 are assumed to correspond to one of the word lines WL0–WL15 in the array 204.

The voltage divider 206 develops the reference voltage signals VREF<1>–<6> having values that are a function of the value of the supply voltage Vpp. For the following description, assume the supply voltage Vpp equals 3.35 volts so that the reference voltage signals VREF<1>–<4> are each greater than the previously discussed threshold value. Recall, each boost select circuit 208 is activated only when the corresponding VREF<1>–<6> signal is active, which means the signal is greater than the threshold value. Thus, in the present example only the boost select circuits 208a–d will be activated responsive to the BSC signals.

The row driver 202a operates in several modes in response to the BSC, XC, and DA signals. Initially, the row driver 202a operates in a precharge mode in response to the XC and DA signals, and during the precharge mode various circuitry in each of the X-drivers 212 is precharged and the output XOUT of each X-driver is driven inactive low. The decoders 214 are also inactive at this point in response to the applied GDA signals and the word lines WL0–15 are driven inactive low. Upon termination of the precharge mode, the row driver 202a operates in a deselect mode responsive to the DA signals. During the deselect mode, three of the four X-drivers 202a–d are deselected responsive to the DA signals so that charge from the node 210 is not routed through these X-drivers to their corresponding outputs XOUT. In the present example, assume the X-drivers 212b–d are deselected, meaning that the X-driver 212a is the selected X-driver.

Once the X-drivers 212b–d have been deselected, the row driver 202a commences operation in the selected mode in response to the DA and XC signals. Initially in the selected mode, the selected X-driver 212a precharges the node 210 to the supply voltage Vpp and at the same time the supply voltage Vpp is applied on the output XOUT1. Prior to the voltage Vpp being applied on the output XOUT1, the GDA signals are applied to the decoders 214a–x to activate one of these decoders, which is assumed to be the decoder 214a in the present example. In response to the GDA signals, the activated decoder 214a activates the addressed word line WL, which in the present example is the word line WL3. The decoder 214 maintains the word lines WL0–2 inactive low and provides the supply voltage Vpp on the output XOUT1 on the word line WL3. The high Vpp on the word line WL3 activates memory cells (not shown) in the array 204 coupled to this word line, and at this point sense amplifiers (not shown) in the array sense the data stored in these cells and drive the associated bit lines (not shown) to the appropriate voltage levels.

Once the data stored in the memory cells coupled to the word line WL3 has been sensed, the node 210 has been precharged to Vpp and the row driver 202a commences operation in the boost mode. The XC signals place the X-driver 212a in the boost mode, and the BSC signals are applied to the boost select circuits 208 and default boost circuit 211 to activate the appropriate ones of these circuits. Recall, in the present example the boost select circuits 208a–d are activated in response to the applied BSC signals due to the values of the reference voltage signals VREF<1>–<4> while the boost select circuits 208e–f are inactive due to the values of the reference voltage signals VREF<5>–<6>. Accordingly, the activated boost select circuits 208a–d drive their outputs high to thereby boost the voltage on the node 210. In response to the increased voltage on the node 210, charge flows from this node through the X-driver 212a to the output XOUT1, and from the output XOUT1 through the decoder 214a and onto the word line WL3 to thereby develop the boosted voltage BV on the word line WL3. At this point, the activated memory cells (not shown) in the memory-cell array 204 that are to store the full supply voltage Vpp are restored to this value. The row driver 202a thereafter commences operation in the shutdown mode in response to the XC, DA, and BSC signals and the X-driver 212a drives the word line WL3 inactive low turning OFF the memory cells in the array 204 coupled to that word line.

The row driver 202a thus activates a certain number of the boost select circuits 208a–e during operation, with the number of boost select circuits activated depending upon the value of the supply voltage Vpp. In this way, the row driver 202a adjusts the value of the incremental boost voltage IBV as a function of the supply voltage Vpp to maintain the boosted voltage BV at an approximately constant value. In the above example, when the supply voltage Vpp equals 3.6 volts, none of the boost select circuits 208a–e is activated during operation. Instead, only the default boost circuit 211 is activated to provide an incremental boost voltage IBV of approximately 0.6 volts, which when added to the supply voltage Vpp results in the boosted voltage of approximately 4.2 volts. As the boost select circuits 208a–e are sequentially activated, the incremental boost voltage IBV increases by approximately 0.1 volt for each activated boost select circuit. For example, when the supply voltage Vpp is approximately 3.5 volts, the default boost circuit 211 is activated, adding 0.6 volts to the value of the incremental boost voltage IBV, plus the boost select circuit 208a is activated to add another 0.1 volts to the IBV voltage. In this example, the incremental boost voltage IBV equals 0.6 volts plus 0.1 volts or 0.7 volts, which is added to the supply voltage Vpp of 3.5 volts to generate the boosted voltage BV of 4.2 volts. From this description it is seen that the IBV voltage increases and decreases as a piecewise constant function in a step wise manner. Thus, as individual boost select circuits 208 are sequentially activated the IBV voltage sequentially increases to the next higher level for each activated circuit. Conversely, as individual boost select circuits 208 are sequentially deactivated the IBV voltage sequentially decreases to the next lower level for each deactivated circuit.

As more or fewer of the boost select circuits 208a–f are activated, the charge pumped to the node 210 and thus the incremental boost voltage IBV varies to thereby maintain the boosted voltage BV constant. As the supply voltage Vpp decreases, more boost select circuits 208a–f are activated to pump more charge from the node 210 to the selected word line WL, which results in the incremental boost voltage IBV increasing to thereby maintain the boosted voltage BV constant. Conversely, as the supply voltage Vpp increases, fewer boost select circuits 208a–f are activated to pump less charge from the node 210 to the selected word line WL, which results in the incremental boost voltage IBV decreasing to thereby maintain the boosted voltage BV at the desired value. Activation of each boost select circuit 208a–f is determined by the corresponding reference voltage signal VREF which, in turn, has a value that is a function of the supply voltage Vpp. As a result, the number of activated boost select circuits 208a–f and thus the incremental boost voltage IBV are functions of the value of the supply voltage Vpp. All of the other row drivers 202b–n in the DRAM 200 operate in the same way as just described for the row driver 202a to activate a selected one of the four corresponding word lines WL. The row driver 202a prevents a higher than necessary boosted voltage BV from being developed on the word lines WL0–3 and in this way reduces stress placed upon components in the DRAM 200. This increases the operational life of components in the DRAM 200 and thereby increases the overall operational life of the DRAM itself.

The embodiment of FIG. 2 is presented merely by way of example, and in other embodiments of the DRAM 200 the numbers of components in each variable voltage row driver 202 may vary. For example, in other embodiments each row driver 202 includes more or fewer boost select circuits 208, X-drivers 212, and decoders 214. Moreover, in other embodiments each decoder 214 drives more or fewer word lines WL. The DRAM 200 may be contained in an ASIC or other type of integrated circuit or may be a stand alone integrated circuit. Furthermore, in another embodiment of the DRAM 200 only the supply voltage Vdd is applied to the DRAM and thus to the variable voltage row drivers 202. In this embodiment, the variable voltage row drivers 202 boost the supply voltage Vdd as required and the sizes of components in the row drivers 202 such as boost capacitors (not shown) are adjusted as required as will be understood by those skilled in the art. The values of the voltages Vdd and Vpp vary in other embodiments of the present invention and will depend at least in part on the size of components forming the DRAM 200. The polarities of these voltages may vary in further embodiments. The operation of the variable voltage row drivers 202 also ensure that in a situation where the supply voltage Vdd has a minimum value a sufficient boosted voltage BV is developed on the word lines WL to ensure that this minimum Vdd developed on the bit lines BL is stored in the memory cells in the array 204.

Figure 3:
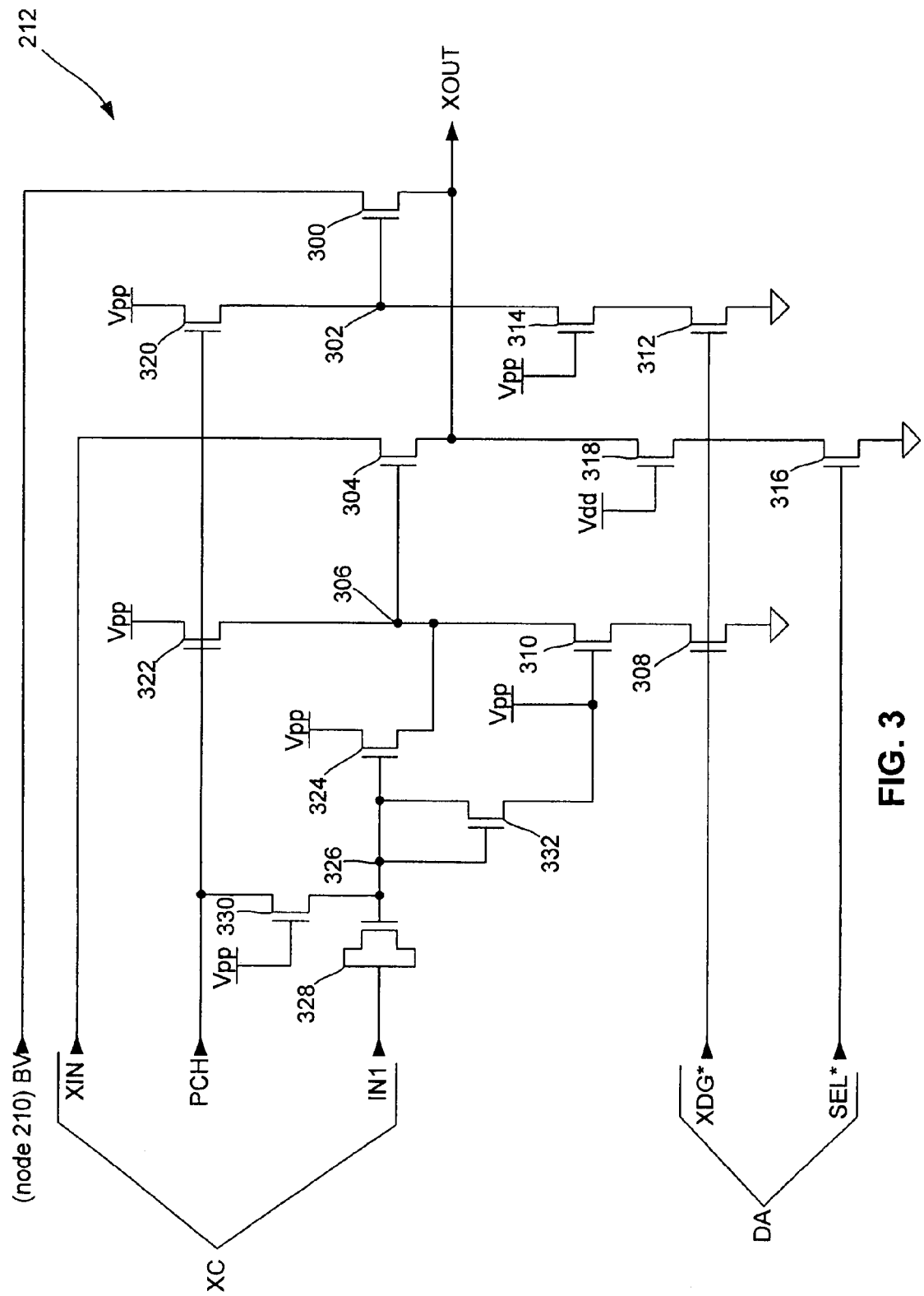
FIG. 3 is a schematic of one embodiment of a single one of the X-driver circuits contained in the row driver of FIG. 2.

FIG. 3 is a schematic of one embodiment of a single one of the X-driver circuits 212 contained in the row driver 202a of FIG. 2. The X-driver circuit 212 includes an output circuit formed by an NMOS transistor 300 coupled to an output XOUT and to receive a boost signal B corresponding to the voltage on the node 210 of FIG. 2, and the gate of the NMOS is coupled to a boosted internal node 302. An intermediate switching circuit is formed by an NMOS transistor 304 coupled to the output XOUT and to receive an input signal XIN corresponding to one of the XC signals (see FIG. 2), and the gate of the NMOS transistor is coupled to an internal node 306. A first series connected pair of transistors 308, 310 is coupled between the boosted internal node 306 and ground and a second series connected pair of transistors 312, 314 is coupled between the internal node 302 and ground. The transistors 308–314 collectively operate as a discharge circuit to discharge the nodes 302, 306 to ground responsive to a discharge signal XDG* applied to the transistors 308, 312, with the XDG* signal being one of the decoded address signals applied to the X-driver 212. The transistors 310 and 314 function as DC offset components to reduce the voltage applied across the transistors 308, 312 when the nodes 302, 306 are at a boosted voltage level.

A series connected pair of transistors 316, 318 clamp the output XOUT to ground in response to a selection signal SEL* being inactive high, with the transistor 318 again operating as a DC offset component to limit the voltage applied across the transistor 316. A first transistor 320 and second transistor 322 coupled between the nodes 302 and 306, respectively and Vpp precharge these nodes to Vpp in response to a precharge signal PCH, which is another one of the XC signals. Finally, the X-driver 212 includes an input circuit formed by a transistor 324 coupled between the supply voltage Vpp and the internal node 306 and having its gate coupled to an input node 326. An input signal IN1 is coupled to the input node 326 through a capacitor 328 and a transistor 330 discharges the input node 326 when the precharge signal PCH is inactive low. A diode-coupled transistor 332 limits the maximum voltage on the input node 326 to approximately a threshold voltage VT of the transistor above the supply voltage Vpp.

In operation, the X-driver 212 operates in precharge, deselect, select, boost, and shutdown modes of operation. In the precharge mode, the PCH signal goes high to precharge the nodes 302, 306 to approximately Vpp (Vpp less the threshold voltages of the transistors 320, 322). At the same time, the signal XDG* is active low and SEL* is inactive high, clamping the output XOUT low through the transistors 316 and 318. The remaining signals B, XIN, and IN1 are all low during the precharge mode.

Once the nodes 302, 306 are precharged, the X-driver 212 operates in either the select or deselect modes of operation. The X-driver 212 operates in the deselect mode when the X-driver is not associated with the word line WL being activated, which is determined by the decoded address signals DA which are SEL* and XDG*. To place the X-driver 212 in the deselect mode, the PCH signal goes inactive low and the XDG* signal goes inactive high. In response to the low PCH signal, the input node 326 goes low and in response to the high XDG* signal the nodes 302 and 306 are driven low through the transistors 312, 314 and 308, 310. At this point, when the non-decoded signals B and XIN go active high, these signals do not affect the output XOUT of the X-driver 212. Note that the PCH signal goes inactive low for the deselected X-drivers 212 and thus the PCH signal may be viewed as a decoded address signal. The SEL* signal remains inactive high during the deselect mode to clamp the output XOUT low through the transistors 316, 318.

When the X-driver 212 is selected, meaning the X-driver is associated with the word line WL being activated, the PCH remains high and the XDG* signal remains active low. The SEL* signal goes inactive low to stop the output XOUT from being held low through the transistors 316, 318. At this point, the signal XIN goes to near Vpp. Because the node 306 is precharged to Vpp, the transistors 322 and 324 are turned OFF and the transistor 308 is turned OFF in response to the inactive low XDG* signal. As a result, the gate-to-drain or "inversion capacitance" of the transistor 304 is able to boost the voltage on node 306 to approximately 2Vpp. This allows the full magnitude of the signal XIN to be applied through the transistor 304 and onto the output XOUT. In response to the XIN signal on the output XOUT, the inversion capacitance of the transistor 300 results in the voltage on the boosted internal node 302 being boosted to approximately 2Vpp. As a result, the full magnitude of the XIN signal on the output XOUT is applied through the transistor 300 to the node 210 which is also indicated as the signal B in FIG. 3. The XIN signal applied to the node 210 precharges capacitors (not shown) coupled to this node and contained in the boost select circuits 208, as will be described in more detail below. Because the XIN signal has a magnitude of approximately Vpp the node 210 is at this point precharged to approximately Vpp.

Note that at this point the XIN signal having a magnitude of Vpp is output from the X-driver 212 and coupled through the decoder 214 (FIG. 2) to activate the corresponding word line WL. The X-driver 212 remains in this state until data from the memory cells coupled to the activated word line WL is sensed, as previously described. Once the data has been sensed, the IN1 signal goes high to start operation of the X-driver 212 in the boost mode. In response to the IN1 signal going high, the voltage on the input node 326 of approximately Vpp is boosted to approximately 2Vpp due to the capacitor 328. This is an approximate value for the voltage on the node 326 since this voltage does not reach 2Vpp due to the threshold voltage Vt of the transistor 330, which reduces the precharged value on this node by the threshold voltage. In response to the input node 326 going to approximately 2Vpp, the internal node 306 is discharged to approximately the supply voltage Vpp through the transistor 324. As a result of the internal node 306 being driven to approximately the supply voltage Vpp, the transistor 304 turns OFF since the gate voltage on the node 306 of approximately Vpp is equal to the source voltage on the output XOUT (i.e., Vgs=0).

At this point, the boost signal B from the activated boost select circuits 208a–f goes to the boosted voltage BV, and this voltage is applied through the transistor 300 to the output XOUT. Note that the boosted voltage BV on the output XOUT boosts the voltage on the boosted internal node 302 through the inversion capacitance of the transistor 300 to a voltage greater than the boosted voltage to allow the full boosted voltage to be applied through the transistor and onto the output XOUT. In operation, charge from the node 210 is coupled through the transistor 300 to the output XOUT and then from the output through the decoder 214 (FIG. 2) and onto the activated word line WL to thereby develop the boosted voltage BV on the word line. The resulting boosted voltage BV on the word line WL is determined by the amount of charge pumped from the node 210 to the activated word line. The more boost select circuits 208 (FIG. 2) that are activated, the more charge that is pumped from the node 210 through the transistor 300 to the output XOUT of the selected X-driver 212 and thereafter onto the activated word line WL.

Once the boosted voltage BV has been applied to the activated word line WL for the required time to allow data to be reliably stored in the associated memory cells, the X-driver 212 commences operation in the shutdown mode. In the shutdown mode, the sequence of the various signals applied to the X-driver 212 during the select and boost modes is reversed to turn OFF the X-driver and prevent high voltages from developing across various components in the X-driver. Accordingly, the boost select circuits 208 are deactivated, causing the B signal to go back to approximately Vpp and the voltage on the boosted internal node 302 to go back to approximately Vpp. At this point, the XIN signal goes low and output XOUT is discharged low through the transistor 304. The voltages on the boosted internal node 302 and internal node 306 are at this point equal to approximately the supply voltage Vpp and these nodes are maintained at this level due to the high PCH signal keeping the transistors 320, 322 turned ON. The signal SEL* then goes high, turning ON transistor 316 and clamping the output XOUT low through the transistors 316, 318.

Figure 4:
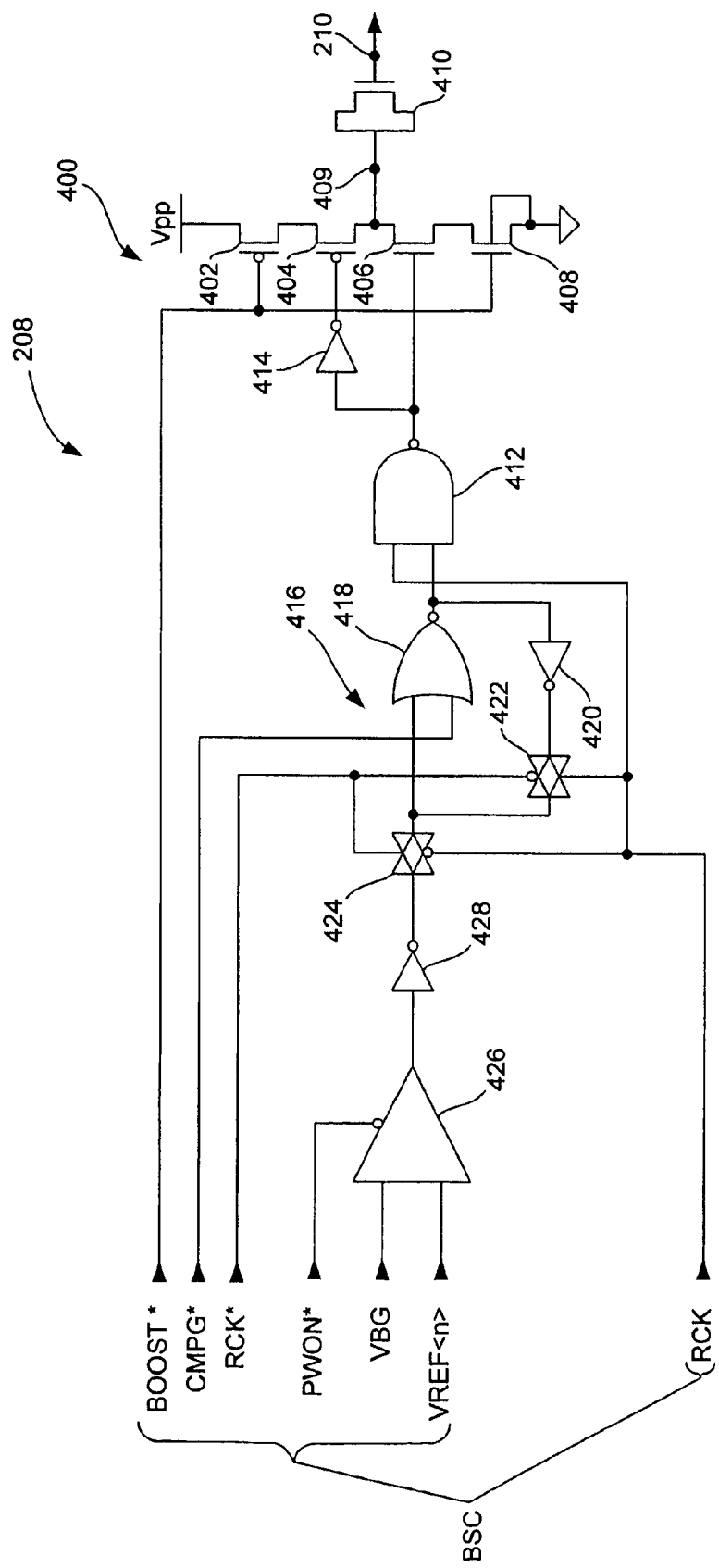
FIG. 4 is a schematic of one embodiment of a single one of the boost select circuits contained in the row driver of FIG. 2.

FIG. 4 is a schematic of an embodiment of a single one of the boost select circuits 208 contained in the row driver 202a of FIG. 2. The boost select circuit 208 includes a tri-state output driver 400 including PMOS transistors 402, 404 and NMOS transistors 406, 408 coupled in series between the supply voltage Vpp and ground. A boost capacitor signal BOOST* signal is applied to selectively enable and disable transistors 402, 408 and an output from the driver 400 is taken from a node 409 interconnecting transistors 404, 406. This output node 409 is coupled through a capacitor 410 to generate an output signal on the node 210. Note that in the row driver 202a of FIG. 2, six boost select circuits 208 are coupled to the node 210 and thus collectively the boost select circuits result in six capacitors 410 being coupled in parallel to the node 210.

A NAND gate 412 applies an output directly to the NMOS transistor 406 and through an inverter 414 to the PMOS transistor 404 to disable these transistors and place the driver 400 in a high-impedance state or enable these transistors to place the driver in a drive mode of operation. A read clock signal RCK is applied to a first input of the NAND gate 412 and a latch circuit 416 applies a second input to the NAND gate. The latch circuit 416 is formed by a NOR gate 418, inverter 420, pass gate 422, and pass gate 424. A compare group signal CMPG* is applied to one the input of the NOR gate 418 to enable the latch circuit 416 to store the current value from the comparator 426, as will be described in more detail below. The pass gates 422 and 424 are selectively enabled and disabled in response to complementary clock signals RCK, RCK*, with the signals being applied so that the pass gates operate in a complementary manner. Thus, when the RCK and RCK* signals are low and high, respectively, the pass gate 424 is turned ON while the pass gate 422 is turned OFF and conversely when the RCK and RCK*signals are high and low, respectively, the pass gate 424 is turned OFF while the pass gate 422 is turned ON.

A comparator 426 compares the corresponding reference voltage signal VREF<n> to a band gap voltage signal VBG that represents a threshold value for the corresponding reference voltage signal. The comparator 426 is enabled and disabled in response to a power on signal PWON*, and when enabled the comparator drives its output high when the reference voltage signal VREF<n> is greater than the VBG signal. Conversely, the comparator 426 drives its output low when the VREF<n> signal is less than the VBG signal. The output of the comparator 426 is applied through an inverter 428 to an input of the pass gate 424, which corresponds to the input of the latch circuit 416. Note that the RCK, RCK* VBG, PWON*, CMPG*, and BOOST* signals correspond to the BSC signals applied to the boost select circuits 208 in FIG. 2.

In operation, the boost select circuit 208 operates in a compare mode and a boost mode. In the compare mode, the BOOST* signal is inactive high turning OFF the transistor 402 and turning ON the transistor 408 and the CMPG* signal is active low to enable the latch circuit 416. Also, the RCK signal is low and the RCK* signal is high, enabling the pass gate 424 and disabling pass gate 422. The PWON* signal is active low, enabling the comparator 426 which, in turn, compares the VBG and VREF<n> signals. When the VREF<n> signal is greater than the VBG signal, the boost select circuit 208 will not be activated to boost the voltage on the node 210. This is true when the value of the supply voltage Vpp has a value such that the particular boost select circuit 208 need not be activated during generation of the boosted voltage BV. Conversely, when the VREF<n> signal is less than the VBG signal the boost select circuit 208 will be activated to boost the voltage on the node 210. Thus, the comparator 426 drives its output low when the boost select circuit 208 is activated and drives its output high when the boost select circuit is deactivated.

At this point, the RCK and RCK* signals are low and high, respectively, turning ON the pass gate 424 and turning OFF the pass gate 422. Also, the CMPG* signal is low to enable the NOR gate 418. The output from the comparator 426 is then applied through the inverter 428 and through the pass gate 424 to the other input of the NOR gate 418. When the output of the comparator 426 is high, meaning the boost select circuit 208 is to be deactivated, this high output is applied through the inverter 428 to apply a low input to the NOR gate 418. The NOR gate 418 now receives two low inputs and applies a high output to the NAND gate 412. When the output of the comparator 426 is low, meaning the boost select circuit 208 is to be activated, this low output is applied through the inverter 428 to apply a high input to the NOR gate 418 which, in turn, applies a low output to the NAND gate 412.

The RCK and RCK* then go high and low, respectively, turning OFF the pass gate 424 and turning ON the pass gate 422. When the pass gate 422 turns ON, the output from the NOR gate 418 is fed back through the inverter 420 and pass gate 422 to one input of the NOR gate 418, thereby latching the output from the comparator 426 in the latch circuit 416. Also note that when the RCK signal goes high, the NAND gate 412 is enabled and depending upon the data stored in the latch circuit 416 either drives its output high to enable the transistors 404, 406 are low to disable these transistors. The output of the NOR gate 418 is high when the output of the comparator 426 is high, meaning the boost select circuit 208 is to be deactivated. In this situation, when the RCK signal goes high enabling the NAND gate 412, the NAND gate drives its output low and this low output turns OFF the transistor 406 and is applied through the inverter 414 to turn OFF the transistor 404, placing the node 409 in a high impedance state. Conversely, the output of the NOR gate 418 is low when the output of the comparator 426 is low, which is true when the boost select circuit 208 is to be activated. In this situation, when the RCK signal goes high the NAND gate maintains its output high, and this high output turns ON the transistor 406 and is applied through the inverter 414 to turn ON the transistor 404. At this point, the BOOST* signal is inactive high so the transistor 408 is turned ON and transistor 402 is turned OFF. The node 409 is accordingly driven to ground through the transistors 406, 408 when the boost select circuit 208 is being activated.

At this point, the BOOST* signal goes active low to turn ON the transistor 402 and turn OFF the transistor 408 and thereby initiate the boost mode of operation. In response to the BOOST* signal going low, the transistor 402 turns ON and the driver 400 drives the node 409 to the supply voltage Vpp through the transistors 402, 404. Note that prior to the boost select circuit 208 driving the node 409 high, the node 210 has been precharged to the supply voltage Vpp and thus at this point the voltage on the node 210 is bootstrapped to approximately BV when the node 409 goes high. From this description of the single boost select circuit 208, it is seen that as more boost select circuits are activated more capacitors 410 bootstrap the voltage on node 210. As more capacitors 410 bootstrap the voltage on node 210, more capacitors supply charge to the node 210 and this charge is then routed to the activated word line WL while fewer capacitors 410 results in less charge being routed to the word line. Note that when the circuit 208 is deactivated, the NAND gate 412 provides a low output, turning OFF transistors 404, 406 and thereby presenting a high impedance on the node 409. In response to the BOOST* signal going active low, the driver 400 does not drive the node 409 in this situation since the transistors 404 and 406 are turned OFF.

Figure 5:
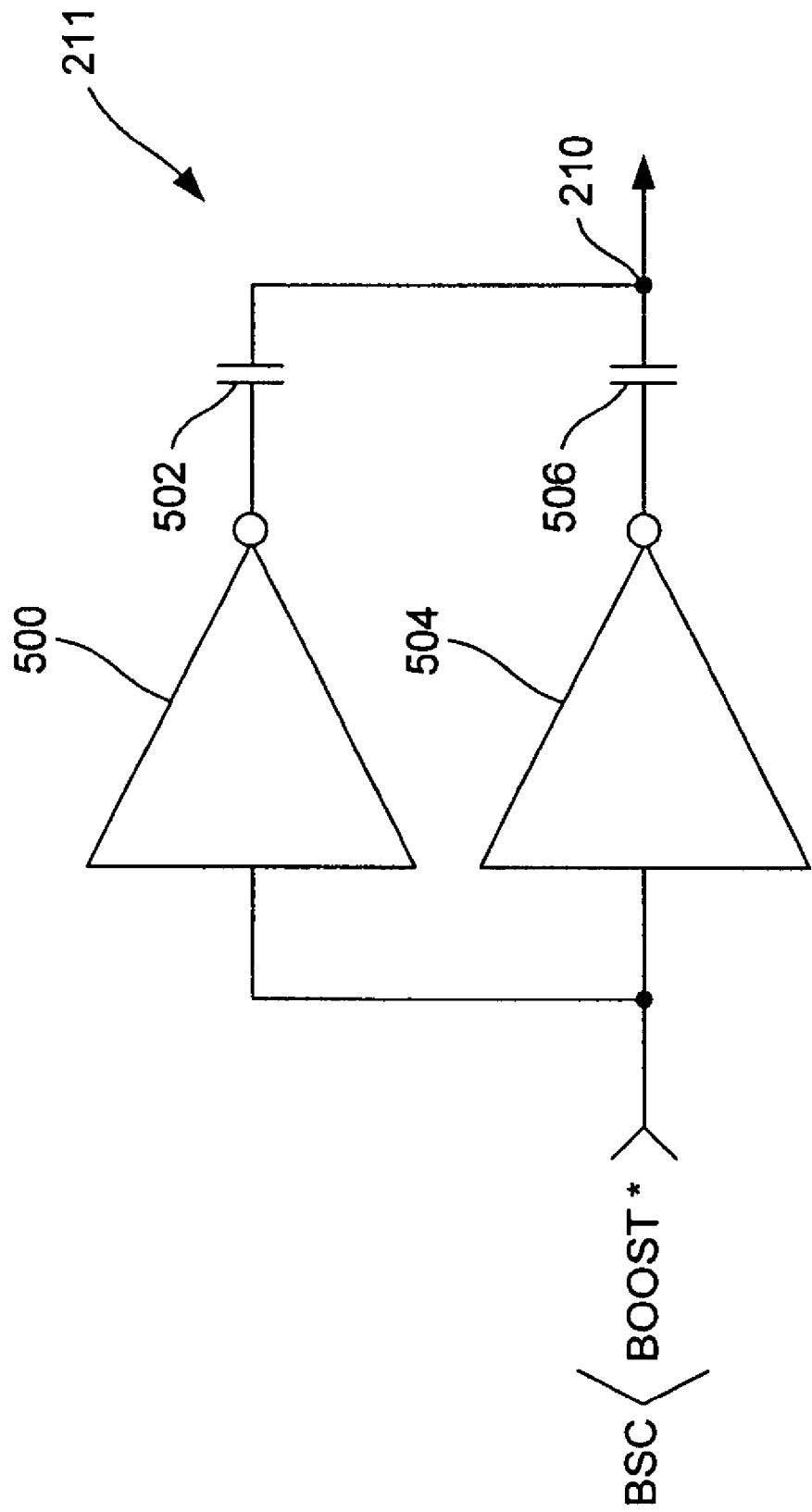
FIG. 5 is a schematic of one embodiment of the default boost circuit contained in the row driver of FIG. 2.

FIG. 5 is a schematic of one embodiment of the default boost circuit 211 contained in the row driver 202a of FIG. 2. In this embodiment, the default boost circuit 211 includes a first inverter 500 and capacitor 502 coupled in parallel with a second inverter 504 and capacitor 506. The BOOST* signal is applied to the inputs of the inverters 500 and 504 and one terminal of the capacitors 502 and 506 is coupled to the node 210. In operation, the BOOST* signal is initially inactive high causing each inverter 500 and 504 to drive its output low. At this point, the node 210 is precharged to approximately the supply voltage Vpp. The BOOST* signal corresponds to one of the BSC signals, and goes active low to activate the default boost circuit 211. In response to the BOOST* signal going active low, each inverter 500, 504 drives its output high with the capacitors 502 and 506 thereafter bootstrapping the voltage on the node 210 to BV.

Figure 6:
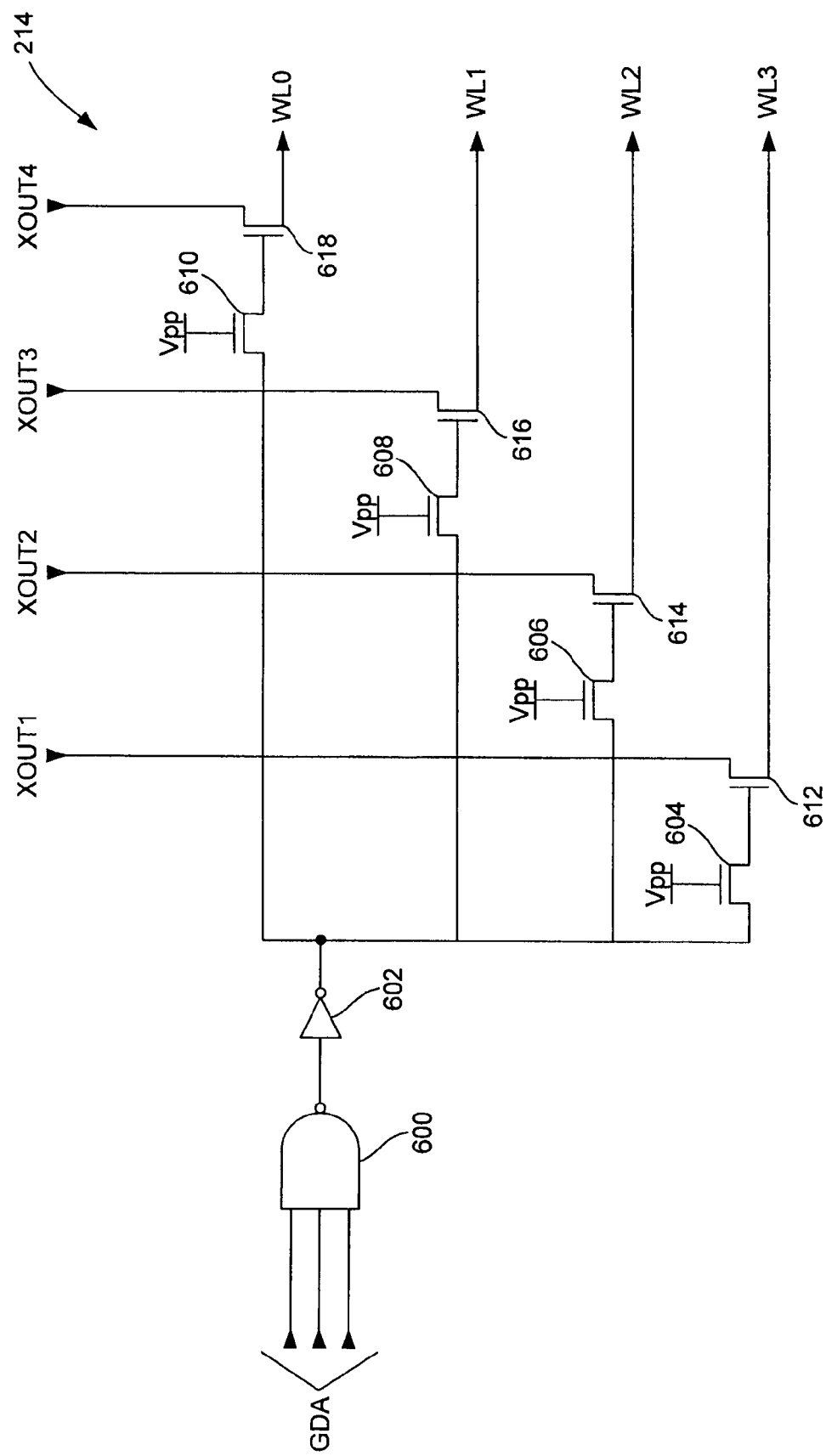
FIG. 6 is a schematic of one embodiment of the decoder contained in the row driver of FIG. 2.

FIG. 6 is a schematic of one embodiment of the decoder 214 contained in the row driver 202a of FIG. 2. The decoder 214 includes a NAND gate that receives the group decoded address signals GDA and applies an output through an inverter 602 and through for enabled transistors 604–610 to selectively enable or disable four transistors 612–618. The transistors 612–618 are coupled between the outputs XOUT1–XOUT4, respectively, from corresponding X-drivers 212a–d (FIG. 2) and corresponding word lines WL0–3. In operation, the decoder 214 is disabled when any of the GDA signals are low. In this situation, the NAND gate 600 drives its output high and this high output is applied through the inverter 602 to turn OFF the transistors 612–618. This isolates the outputs XOUT1–4 from the word lines WL0–3, respectively. The decoder 214 is enabled when all the GDA signals are high, causing the NAND gate 600 to drive its output low. This low output is applied through the inverter 602 to provide high signals on the gates of each of the transistors 612–618 and thereby turn ON each of these transistors. At this point, when one of the outputs XOUT1 goes high the voltage on its output is bootstrapped through the corresponding transistor 612–618 onto the corresponding word line WL0–3.

Figure 7:
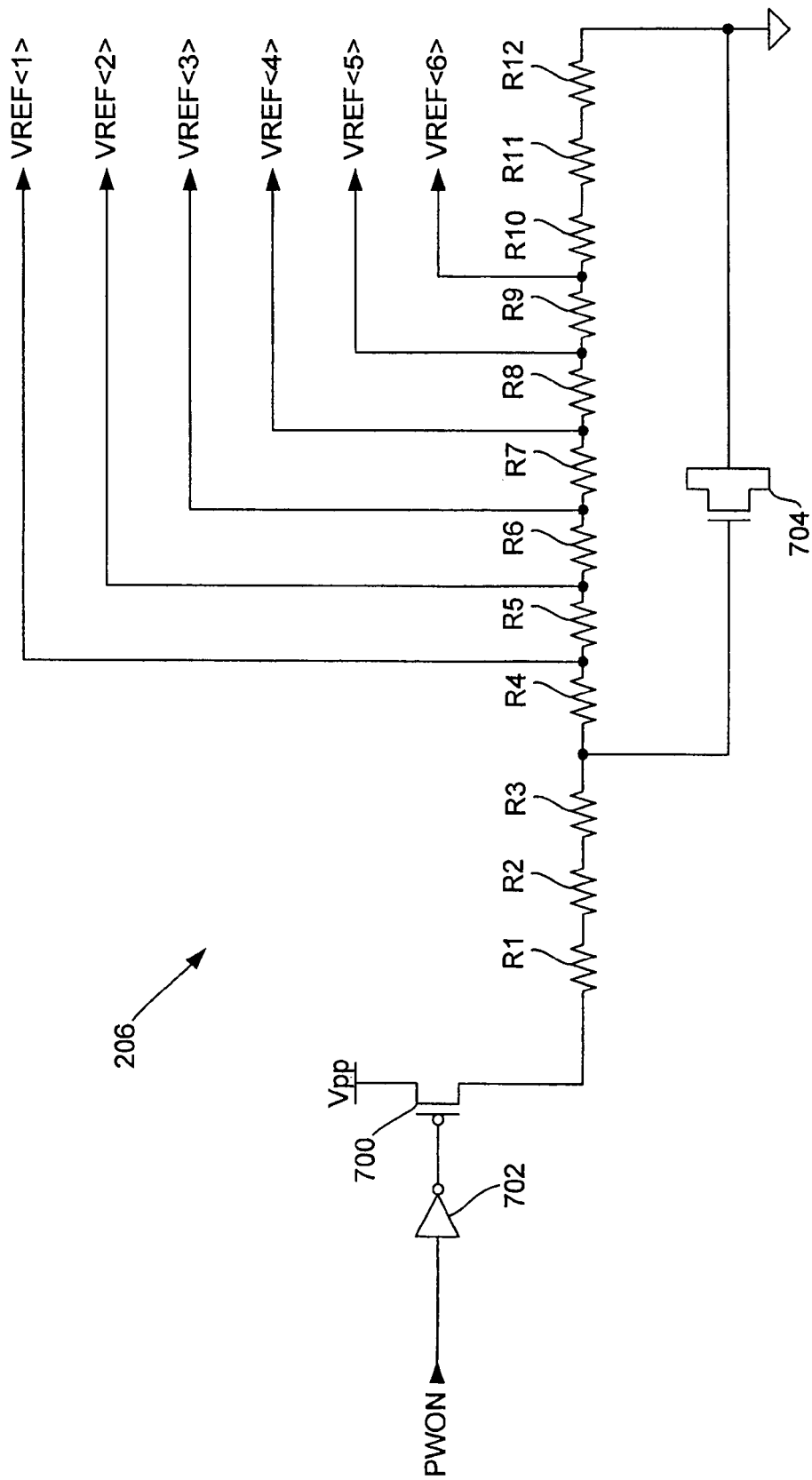
FIG. 7 is a schematic of one embodiment of the voltage divider circuit contained in the row driver of FIG. 2.

FIG. 7 is a schematic of one embodiment of the voltage divider circuit 206 contained in the row driver 202a of FIG. 2. The voltage divider 206 includes a PMOS transistor 700 and a plurality of resistors R1–R12 coupled in series between the supply voltage Vpp and ground. Voltages are taken from selected nodes interconnecting the resistors R1–R12 to thereby provide the reference voltage signals VREF<1>–VREF<6> as shown. The PWON signal is applied through an inverter 702 to turn ON the transistor 700 when the PWON signal is active high. A capacitor 704 is coupled in parallel with resistors R4–R12 to filter any noise across these resistors and provide an RC time constant in combination with the resistors R1–R12 that is appropriate for the required response requirements of the voltage divider circuit 206. As the supply voltage Vpp increases the voltages VREF<1><6> increase and sequentially exceed the threshold value (VBG) as the supply voltage increases, with the VREF<1> signal exceeding the threshold value first, then VREF<2>, then VREF<3>, and so on as the supply voltage Vpp increases.

Figure 8:
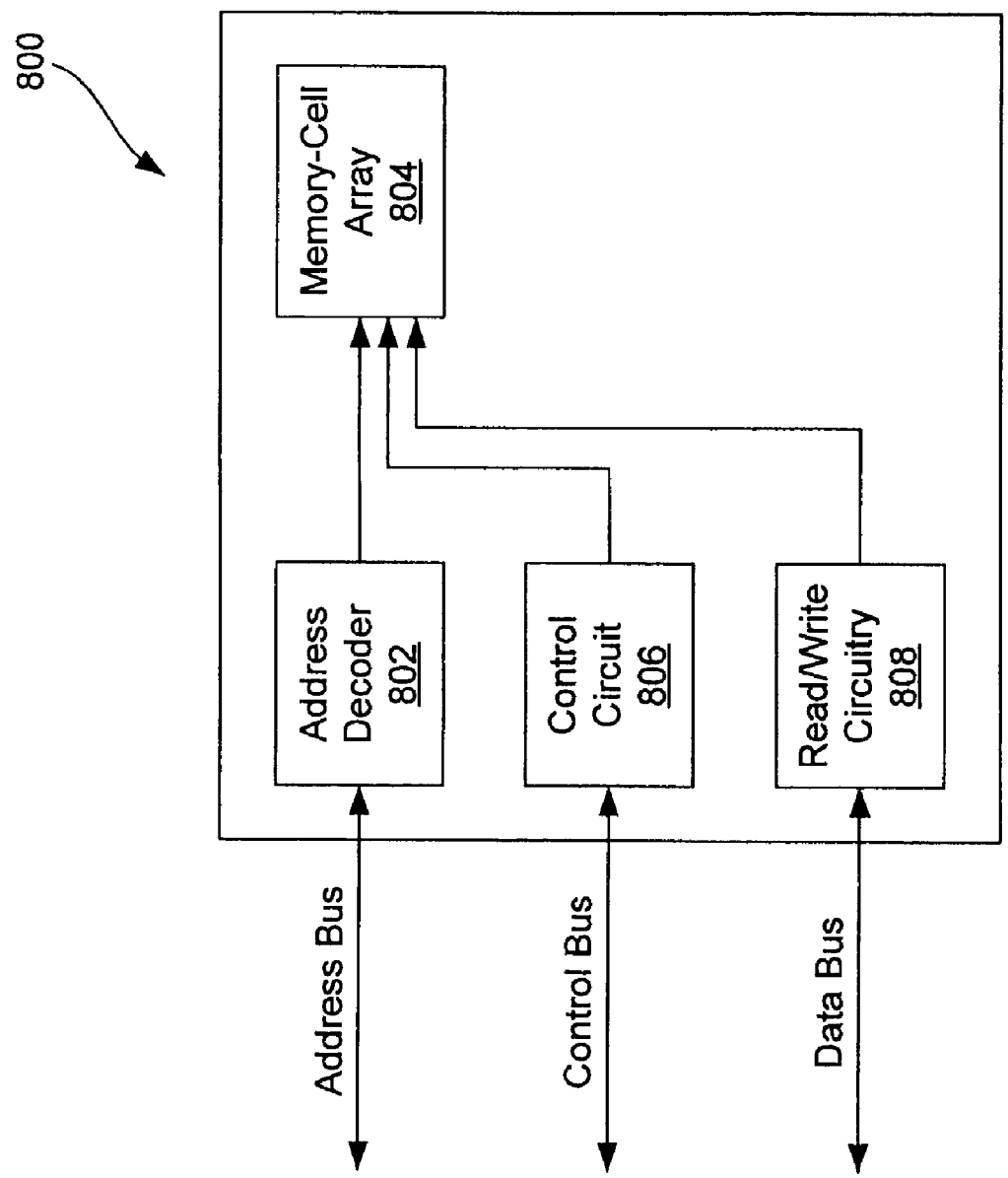
FIG. 8 is a functional block diagram of a memory device including the row driver of FIG. 2 according to an embodiment of the present invention.

FIG. 8 is a functional block diagram of a memory device 800 including the row drivers 202 of FIG. 2 contained in an address decoder 802 in the memory device according to an embodiment of the present invention. The address decoder 802 is coupled to an address bus to receive address signals and is operable to decode these address signals and apply the decoded address signals to a memory-cell array 804. A control circuit 806 is coupled to a control bus to receive control signals applied to the memory device 800 and to generate a plurality of control signals in response to these applied control signals. The control signals generated by the control circuit 806 are applied to various components in the memory device 800 to control the overall operation of the device. Read/write circuitry 808 is coupled to a data bus and operates to transfer data between the data bus and the memory-cell array 804.

Figure 9:
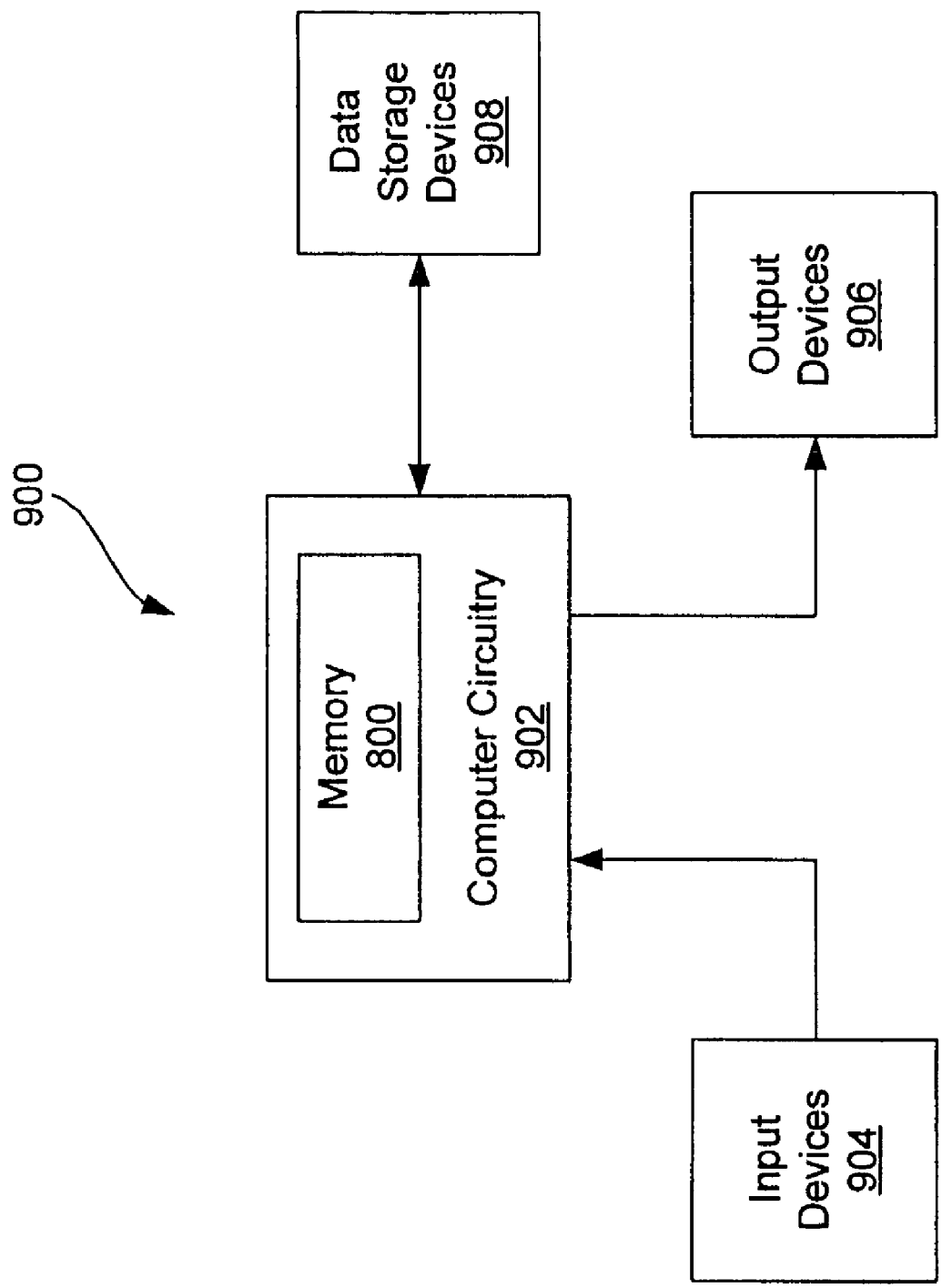
FIG. 9 is a functional block diagram of a computer system including the memory device of FIG. 8 according to an embodiment of the present invention.

In operation, external circuitry (not shown) provides address, control, and data signals on the respective busses to the memory device 800. During a read cycle, the external circuitry provides a memory address on the address bus and control signals on the control bus to the memory device 800. In response to the memory address on the address bus, the address decoder 802 provides a decoded memory address to the memory-cell array 804 and the row drivers 202 (not shown) in the decoder operate as previously described to activate the addressed word line in the memory-cell array. The control circuit 806 provides control signals to the memory-cell array 804 in response to the control signals on the control bus. The control signals from the control circuit 806 control the memory-cell array 804 to provide data to the read/write circuitry 808. The read/write circuitry 808 then provides this data on the data bus for use by the external circuitry. During a write cycle, the external circuitry provides a memory address on the address bus, control signals on the control bus, and data on the data bus. Once again, the address decoder 802 decodes the memory address on the address bus and provides a decoded address to the memory-cell array 804 and the row drivers 202 operate as previously described to activate the addressed word line in the memory-cell array. The read/write circuitry 808 provides the data on the data bus to the memory-cell array 804 and this data is stored in the addressed memory cells in the memory-cell array under control of the control signals from the control circuit 806. The memory device 800 may be any of a variety of different types of memory device, such as a DRAM, SDRAM, DDR DRAM, SLDRAM, and RAMBUS DRAM, and FLASH memory device. Moreover, the row drivers 202 may be placed in integrated circuits other than memory devices but which similarly require boosted voltages. FIG. 9 is a functional block diagram of a computer system 900 including the memory device 800 of FIG. 8 according to an embodiment of the present invention. The computer system 900 includes computer circuitry 902 that contains the memory device 800. Typically, the computer circuitry 902 is coupled through address, data, and control buses to the memory device 800 to provide for writing data to and reading data from the memory device. The computer circuitry 902 includes circuitry for performing various computing functions, such as executing specific software to perform specific calculations or tasks. In addition, the computer system 900 includes one or more input devices 904, such as a keyboard or a mouse, coupled to the computer circuitry 902 to allow an operator to interface with the computer system. Typically, the computer system 900 also includes one or more output devices 906 coupled to the computer circuitry 902, such output devices typically including a printer and a video terminal. One or more data storage devices 908 are also typically coupled to the computer circuitry 902 to store data or retrieve data from external storage media (not shown). Examples of typical storage devices 908 include hard and floppy disks, tape cassettes, compact disk read-only (CD-ROMs) and compact disk read-write (CD-RW) memories, and digital video disks (DVDs).

Even though various embodiments and advantages of the present invention have been set forth in the foregoing description, the above disclosure is illustrative only, and changes may be made in detail and yet remain within the broad principles of the present invention. Moreover, the functions performed by various components may be implemented through circuitry other than that disclosed for the various embodiments described above. Such functions can also be combined to be performed by fewer elements, separated and performed by more elements, or combined into different functional blocks depending upon design considerations for the device or system being implemented, as will appreciated by those skilled in the art. Other embodiments for the components illustrated in FIGS. 3–7 are also within the scope of the present invention, with these embodiments being presented merely by way of example. Therefore, the present invention is to be limited only by the appended claims.

What is claimed is:

1. A row driver circuit adapted to receive a supply voltage and operable to develop a boosted voltage having a magnitude that is equal to the sum of an incremental boost voltage and a magnitude of the supply voltage, the magnitude of the incremental boost voltage being a function of the magnitude of the supply voltage to maintain the boosted voltage at an approximately constant value independent of variations in the supply voltage, wherein the magnitude of the boosted voltage is greater than the magnitude of the supply voltage by an approximately constant default boost value when the supply voltage is greater than a threshold value.

2. The row driver circuit of claim 1 wherein the supply and boosted voltages comprise positive voltages.

3. The row driver circuit of claim 1 wherein the magnitude of the incremental boost voltage increases as a piecewise constant function in response to increases in the supply voltage and decreases as a piecewise constant function in response to decreases in the supply voltage.

4. A row driver circuit, comprising:
 a voltage detection circuit adapted to receive a supply voltage and operable to detect the magnitude of the supply voltage and generate at least one voltage reference signal indicating the detected magnitude;
 a boost selection circuit coupled to the voltage detection circuit and including a boost node, the boost-selection circuit operable to boost a voltage on the boost node to develop charge that can be transferred from the boost node, the amount of charge on the boost node being a function of each voltage reference signal from the voltage detection circuit, and wherein the boost selection circuit comprises:
  a plurality of boost circuits, each boost circuit receiving a corresponding voltage reference signal from the voltage detection circuit and operable responsive to the voltage reference signal being greater than or equal to a threshold value to generate an output signal and operable responsive to the voltage reference signal being less than the threshold voltage to disable generation of the output signal, and wherein the output signals from all the boost circuits collectively provide charge to be transferred from the boost node; and a default boost circuit, the default boost circuit operable to generate an output signal corresponding to another component of the boosted voltage, and wherein the output signal from the default boost circuit provides a default charge to be transferred from the boost node that is added to the charge provided by the boost circuits;

a driver circuit coupled to the boost selection circuit and adapted to receive control and address signals, the driver circuit including a plurality of outputs and operable in response to the control and address signals to transfer charge from the boost node onto a selected output; and a decoder circuit coupled to the outputs of the driver circuit and including a plurality of word line outputs, the decoder circuit being adapted to receive address signals and being operable to transfer charge from the selected output of the driver circuit onto one of the word line outputs to develop a boosted voltage on that word line output.

5. The row driver circuit of claim 4 wherein the voltage detection circuit is operable to generate a plurality of voltage reference signals, each voltage reference signal having a threshold value responsive to the supply voltage having a corresponding value.

6. The row driver circuit of claim 5 wherein the voltage detection circuit further comprises a voltage divider circuit including a plurality of series connected resistive components including a first node adapted to receive the supply voltage and a second node adapted to receive a reference voltage, each of the voltage reference signals corresponding to a signal on one of a plurality of nodes defined between adjoining resistive components.

7. The row driver circuit of claim 6 wherein the voltage detection circuit further comprises a capacitive network coupled in parallel with the resistive components to provide an RC time constant suitable for proper operation of the voltage detection circuit.

8. The row driver circuit of claim 4 wherein each boost circuit comprises:
a tri-state output driver having a data input, an enable input adapted to receive an enable signal, and an output;
a capacitor circuit having a first node coupled to the output of the tri-state output driver and a second node coupled to an output node which is coupled to corresponding output nodes of all boost circuits; and
a logic circuit coupled to the data input of the tri-state output driver and coupled to the voltage detection circuit to receive the corresponding voltage reference signal, and adapted to receive boost control signals, the logic circuit being operable to apply an activation signal on the data input of the tri-state output driver responsive to the boost control signals and the voltage reference signal being greater than or equal to the threshold value.

9. The row driver circuit of claim 4 wherein the default boost circuit comprises:
at least one inverter circuit having an input adapted to receive an activation signal and having an output; and
at least one capacitor circuit having a first node coupled to the output of a corresponding inverter circuit and a second node coupled to the boost node.

10. The row driver circuit of claim 4 wherein the driver circuit comprises:
a plurality of sub driver circuits, each sub driver circuit being coupled to a corresponding output and receiving the control and address signals, and each sub driver circuit operable to provide charge from the boost node on the corresponding output responsive to the control signals and responsive to the address signals activating the sub driver circuit.

11. The row driver circuit of claim 10 wherein each sub driver circuit comprises:
an output switching circuit having a first signal node coupled to the corresponding output node, a second signal node coupled the boost selection circuit to receive charge from the boost node, and a control node coupled to a boosted internal node;
an intermediate switching circuit having a first signal node adapted to receive a control signal, a second signal node coupled the corresponding output node, and a control node coupled to an internal node;
a discharge circuit coupled between the internal and boosted internal nodes and a reference voltage node, and operable in response to the address signals to couple each internal node to the reference voltage node;
a clamping circuit coupled between the corresponding output node and the reference voltage node and operable in response to the address signals to couple the output node to the reference voltage node;
an initial switching circuit coupled to the internal node and operable in response to the control signals to drive the internal node to approximately the supply voltage responsive to the control signals; and
a precharge circuit coupled between the internal and boosted internal nodes and a supply voltage node adapted to receive the supply voltage, and operable in response to the control signals to couple each internal node to the supply voltage node.

12. The row driver circuit of claim 11 wherein the output switching circuit and the intermediate switching circuit each comprise an NMOS transistor.

13. The row driver circuit of claim 11,
wherein the precharge circuit comprises first and second NMOS transistors coupled between the internal node and boosted internal node, respectively;
wherein the discharge circuit comprises first and second pairs of series connected NMOS transistors coupled between the internal node and the boosted internal node, respectively, and wherein one of the transistors in each pair receives one of the address signals and the other transistor has a control node coupled to the supply voltage node;
wherein the clamping comprises first and second series connected NMOS transistors coupled between the output node and reference voltage node, and wherein one of the transistors in each pair receives one of the address signals and the other transistor has a control node coupled the supply voltage node; and
wherein the initial switching circuit includes,
a capacitor circuit having a first node coupled to receive the control signals and a second node coupled to an initial internal node;
a diode-coupled transistor coupled between the initial internal node and the supply voltage node;
a transistor having a first signal node coupled to the supply voltage node, and second signal node coupled to the internal node, and a control node coupled to the initial internal node; and
a transistor having a first signal node coupled to control nodes of the first and second NMOS transistors of the precharge circuit and a second signal node coupled to the initial internal node, and a control node coupled to the supply voltage node.

14. The row driver circuit of claim 4 wherein the decoder circuit comprises:
a plurality of switching circuits, each switching circuit including signal nodes coupled between an output of the driver circuit and a corresponding word line output, and each switching circuit including a control node and being operable to couple the output of the driver circuit to the corresponding word line output responsive to an active control signal on the control node and to isolate the outputs responsive to an inactive control signal on the control node; and
a logic circuit adapted to receive the address signals and coupled to the control nodes of the switching circuits, the logic circuit operable in response to the address signals to selectively activate and deactivate the control signals applied to the switching circuits.

15. A memory device, comprising:
a memory-cell array including a plurality of memory cells;
read/write circuitry coupled between a data bus the memory-cell array;
control circuitry coupled between a control bus and the memory-cell array; and
address decoder circuitry coupled between an address bus and the memory-cell array, the address decoder circuitry including a row driver circuit adapted to receive a supply voltage and operable to develop a boosted voltage having a magnitude that is equal to the sum of an incremental boost voltage and a magnitude of the supply voltage, the magnitude of the incremental boost voltage being a function of the magnitude of the supply voltage to maintain the boosted voltage at an approximately constant value independent of variations in the supply voltage, and wherein the row decoder includes,
a plurality of boost circuits, each boost circuit receiving a corresponding voltage reference signal indicating a value of the supply voltage relative to an associated threshold value and operable responsive to the corresponding voltage reference signal being greater than or equal to the threshold value to generate an output signal and operable responsive to the voltage reference signal being less than the threshold to disable generation of the output signal, and wherein the output signals from all the boost circuits collectively generate the boosted voltage; and
a default boost circuit, the default boost circuit operable to generate an output signal corresponding to another component of the boosted voltage, and wherein the output signal from the default boost circuit provides a default boosted voltage.

16. The memory device of claim 15 wherein the memory device comprises a DRAM.

17. The memory device of claim 15 wherein the supply voltage comprises a supply voltage Vdd applied to the memory device.

18. The memory device of claim 15 wherein the memory-cell array comprises either an n-channel array or a p-channel array.

19. A computer system, comprising:
a data input device;
a data output device;
computer circuitry coupled to the data input and output devices; and
a memory device coupled to the computer circuitry, the memory device including,
a memory-cell array including a plurality of memory cells;
read/write circuitry coupled between a data bus the memory-cell array;
control circuitry coupled between a control bus and the memory-cell array; and
address decoder circuitry coupled between an address bus and the memory-cell array, the address decoder circuitry including a row driver circuit adapted to receive a supply voltage and operable to develop a boosted voltage having a magnitude that is equal to the sum of an incremental boost voltage and a magnitude of the supply voltage, the magnitude of the incremental boost voltage being a function of the magnitude of the supply voltage to maintain the boosted voltage at an approximately constant value independent of variations in the supply voltage, and wherein the row decoder includes,
a plurality of boost circuits, each boost circuit receiving a corresponding voltage reference signal indicating a value of the supply voltage relative to an associated threshold value and operable responsive to the corresponding voltage reference signal being greater than or equal to the threshold value to generate an output signal and operable responsive to the voltage reference signal being less than the threshold to disable generation of the output signal, and wherein the output signals from all the boost circuits collectively generate the boosted voltage; and
a default boost circuit, the default boost circuit operable to generate an output signal corresponding to another component of the boosted voltage, and wherein the output signal from the default boost circuit provides a default boosted voltage.

20. The computer system of claim 19 wherein the memory device comprises a DRAM.

21. The computer system of claim 19 further comprising at least one data storage device coupled to the computer circuitry.

22. A method of generating a boosted voltage, comprising:
detecting a value of a supply voltage;
generating an incremental boost voltage having a value that is a function of the detected supply voltage; and
adding the generated incremental boost voltage to the supply voltage to generate the boosted voltage, and wherein the magnitude of the boosted voltage is greater than the magnitude of the supply voltage by an approximately constant default boost value when the supply voltage is greater than a threshold value.

23. The method of claim 22 wherein detecting a value of a supply voltage comprises;
deriving a plurality of reference voltages from the supply voltage, each reference voltage having a value that is a function of the supply voltage; and
comparing each of the reference voltages to a threshold voltage.

24. The method of claim 22 wherein a magnitude of the incremental boost voltage increases as a piecewise constant function in response to increases in the supply voltage and decreases as a piecewise constant function in response to decreases in the supply voltage.

* * * * *